(12) United States Patent
Amano et al.

(10) Patent No.: US 7,041,603 B2
(45) Date of Patent: May 9, 2006

(54) METHOD FOR PRODUCING MAGNETIC MEMORY DEVICE

(75) Inventors: Minoru Amano, Kanagawa-Ken (JP); Tatsuya Kishi, Kanagawa-Ken (JP); Yoshiaki Saito, Kanagawa-Ken (JP); Tomomasa Ueda, Kanagawa-Ken (JP); Hiroaki Yoda, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 213 days.

(21) Appl. No.: 10/396,435

(22) Filed: Mar. 26, 2003

(65) Prior Publication Data

US 2003/0186552 A1    Oct. 2, 2003

(30) Foreign Application Priority Data

Mar. 29, 2002    (JP)    ............................. 2002-097207

(51) Int. Cl.
*H01L 21/302*    (2006.01)
(52) U.S. Cl. ..................... 438/704; 438/3; 438/692; 438/720; 438/723; 438/724; 438/756; 438/757; 216/22; 216/38
(58) Field of Classification Search ................. 216/22, 216/38; 438/3, 692, 704, 720, 723, 724, 438/754, 756, 757
See application file for complete search history.

(56) References Cited

U.S. PATENT DOCUMENTS 6,211,090 B1 *   4/2001   Durlam et al. ............... 438/692
6,548,849 B1 *   4/2003   Pan et al. ..................... 257/296
6,556,473 B1     4/2003   Saito et al.
6,797,536 B1 *   9/2004   Yoda et al. ..................... 438/48

OTHER PUBLICATIONS

U.S. Appl. No. 10/396,435, filed Mar. 26, 2003, Amano et al.
U.S. Appl. No. 10/862,617, filed Jun. 8, 2004, Nagase et al.
U.S. Appl. No. 10/767,997, filed Feb. 2, 2004, Yoda et al.
U.S. Appl. No. 10/704,552, filed Nov. 12, 2003, Yoda et al.
U.S. Appl. No. 10/671,743, filed Sep. 29, 2003, Yoda et al.
U.S. Appl. No. 10/379,915, filed Mar. 6, 2003, Yoda et al.

* cited by examiner

*Primary Examiner*—Shamin Ahmed
*Assistant Examiner*—Eric B. Chen
(74) *Attorney, Agent, or Firm*—Oblon, Spivak, McClelland, Maier & Neustadt, P.C.

(57) ABSTRACT

There is provided a magnetic memory device which has a small switching current for a writing line and which has a small variation therein. A method for producing such a magnetic memory device includes: forming a magnetoresistive effect element; forming a first insulating film so as to cover the magnetoresistive effect element; forming a coating film so as to cover the first insulating film; exposing a top face of the magnetoresistive effect element; forming an upper writing line on the magnetoresistive effect element; exposing the first insulating film on a side portion of the magnetoresistive effect element by removing a part or all of the coating film; and forming a yoke structural member so as to cover at least a side portion of the upper writing line and so as to contact the exposed first insulating film on the side portion of the magnetoresistive effect element.

25 Claims, 12 Drawing Sheets

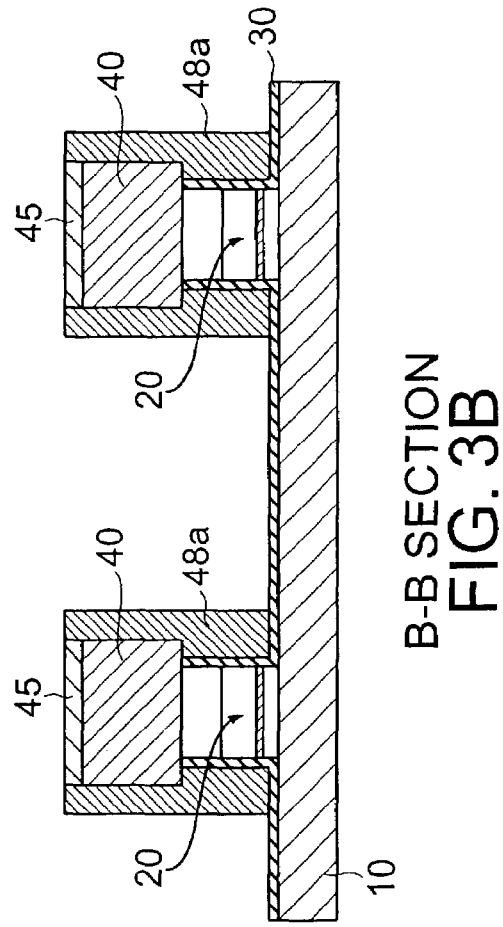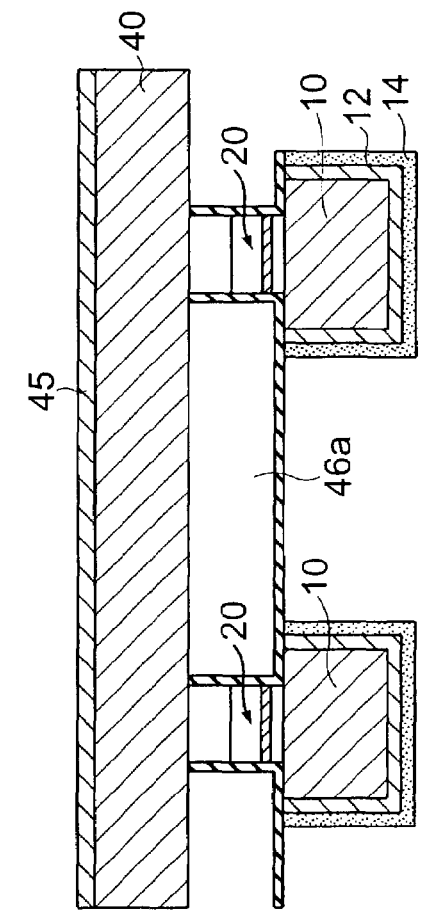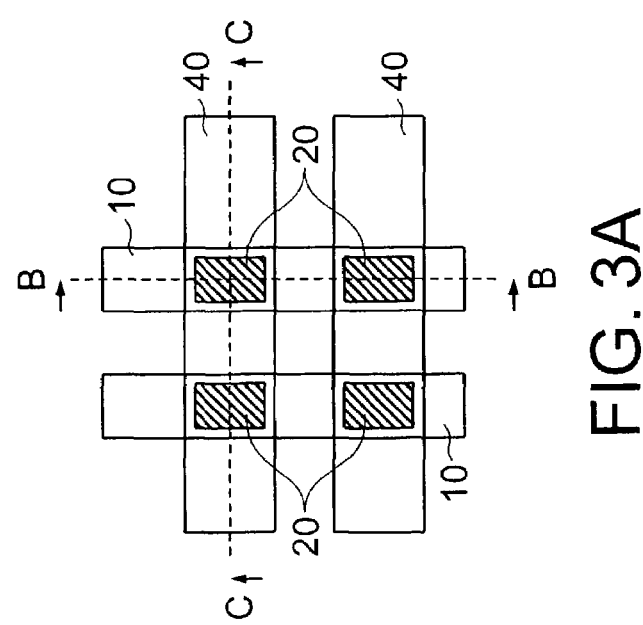

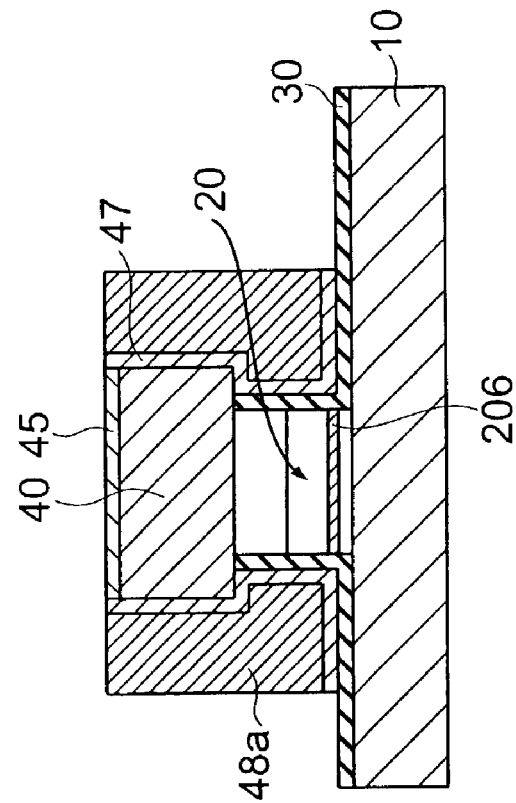
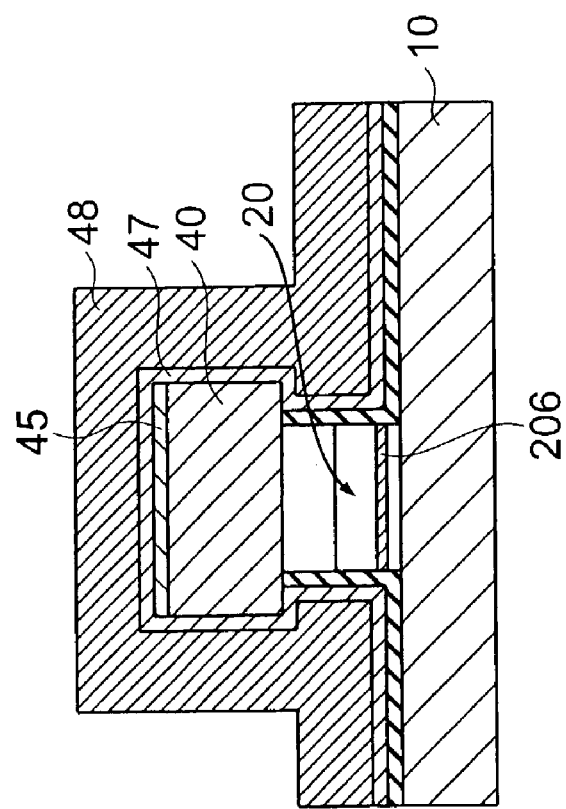

B-B SECTION

C-C SECTION

A-A SECTION

METHOD FOR PRODUCING MAGNETIC MEMORY DEVICE

CROSS REFERENCE TO RELATED APPLICATION

This application is based upon and claims the benefit of priority from the prior Japanese Patent Application No. 2002-97207 filed on Mar. 29, 2002 in Japan, the entire contents of which are incorporated by reference.

BACKGROUND OF THE INVENTION

1. Field of the Invention

The present invention generally relates to a method for producing a magnetic memory device. More specifically, the invention relates to a method for producing a magnetic random access memory (MRAM) having a magnetoresistive effect element in a memory cell portion.

2. Related Art

A magnetic random access memory (MRAM) is a memory unit which has magnetoresistive effect elements, exhibiting magnetoresistive effect in a cell portion for storing information and which is noticed as a next generation memory device characterized by a rapid operation, a large capacity and nonvolatility. The magnetoresistive effect is a phenomenon wherein electrical resistance varies in accordance with the direction of magnetization of a ferromagnetic material when a magnetic field is applied to the ferromagnetic material from the outside. A memory unit (MRAM) can be operated by using such a direction of magnetization of a ferromagnetic material for recording information and by reading information on the basis of the magnitude of an electrical resistance corresponding thereto.

In recent years, taking advantage of the fact that a rate of change in resistance due to the magnetoresistive effect (MR ratio) has reached 20% or more by the tunneling magnetoresistive effect (which will be also hereinafter referred to as the TMR effect) in a ferromagnetic tunnel junction including a sandwich structure wherein an insulating layer (a tunnel barrier layer) is sandwiched between two ferromagnetic layers, MRAMs using a tunneling magnetoresistive effect element (which will be also hereinafter referred to as a TMR element) utilizing the tunneling magnetic effect are expected and noticed.

In use of a TMR element for a magnetoresistive effect element of a memory cell of an MARM, a magnetization fixed layer, in which the direction of magnetization is fixed to one direction so as not to vary, one of two ferromagnetic layers sandwiching a tunnel barrier layer therebetween, is used as a magnetization reference layer whereas a magnetization free layer, in which the direction of magnetization can be easily inverted to another direction, the other layer of the two ferromagnetic layers is used as a storage layer. Information can be stored by causing states, in which the directions of magnetization in the reference layer and storage layer are parallel and antiparallel to each other, to correspond to binary information "0" and "1".

Information to be recorded is written by inverting the direction of magnetization in the storage layer by a magnetic field induced by a current flowing through a writing line provided in the vicinity of a TMR element. The recorded information is read by detecting a variation of resistance due to the TMR effect. Therefore, in the storage layer, the MR ratio due to the TMR effect is preferably large, and the magnetic field required to invert magnetization, i.e., the switching magnetic field, is preferably small.

On the other hand, it is required to fix the direction of magnetization in the reference layer so as to be difficult to be inverted. Therefore, there is used a structure wherein an antiferromagnetic layer is provided so as to contact a ferromagnetic layer serving as the reference layer so that it is difficult to invert magnetization by the exchange coupling force. Such a structure is called a spin-valve structure. In this structure, the direction of magnetization in the reference layer is determined by annealing while applying a magnetic field (a magnetization fixing annealing).

By the way, since the magnetization inversion in the storage layer uses the magnetic field induced by the current flowing through the writing line as described above, there is a problem in that, if the switching magnetic field in the storage layer is large, the current flowing through the writing line increases, so that electric power consumption increases. In order to solve this problem, as shown in FIG. 12A, there is provided a bit line 40 with yoke wherein a writing bit line 40, which is one of a writing word line 10 and writing bit line 40 serving as writing lines, is covered with a yoke 80 of a soft magnetic material to intensify a current induced magnetic field, which is produced from the writing bit line 40, in the vicinity of the TMR element 20. In such a bit line 40 with yoke, as a distance between the tip end portion of the yoke 80 and the storage layer 206 decreases, the magnetic field produced in the vicinity of a storage layer 206 is stronger, so that magnetization in the storage layer can be inverted by a smaller writing current. Furthermore, in FIG. 12A, reference number 75 denotes an insulating layer.

Therefore, as shown in FIG. 12B, the tip end portion of the yoke 80 is preferably extended below the writing bit line 40 so as to approach the TMR element 20.

By the way, when the writing bit line 40 is formed, there is some possibility that the writing bit line 40 is displaced from the TMR element 20. Therefore, the width of the writing bit line 40 is usually designed to be larger than the TMR element 20 by making allowance for the displacement.

In addition, in the structure where the yoke 80 is extended to the vicinity of the TMR element 20 as shown in FIG. 12B, there is some possibility that the yoke 80 contacts the TMR element 20 to electrically short-circuit, so that it is required to increase the width of the writing bit line 40 in view of a margin corresponding thereto. For example, if the displacement in alignment is 50 nm and the margin for preventing short-circuit is 50 nm, the width of the writing bit line 40 may be designed to be larger than the TMR element 20 by 100 nm on both sides thereof. As a result, the distance between the storage layer 206 of the TMR element 20 and the tip end of the yoke 80 is at least 100 nm, and this distance is increased to 150 nm at the maximum if the writing bit line 40 is displaced. That is, there are problems in that the distance between the storage layer 206 and the yoke 80 increases and varies, so that the switching current itself passing through the writing bit line 40 can not be decreased, whereby the variation in magnitude of current required for switching is large.

SUMMARY OF THE INVENTION

It is therefore an object of the present invention to provide a method for producing a magnetic memory device wherein the variation in current required to switch each memory cell is small.

According to a first aspect of the present invention, a method for producing a magnetic memory device, comprises: forming a magnetoresistive effect element; forming a first insulating film so as to cover the magnetoresistive effect element; forming a coating film so as to cover the first insulating film; exposing a top face of the magnetoresistive effect element; forming an upper writing line on the magnetoresistive effect element; exposing the first insulating film on a side portion of the magnetoresistive effect element by removing a part or all of the coating film; and forming a yoke structural member so as to cover at least a side portion of the upper writing line and so as to contact the exposed first insulating film on the side portion of the magnetoresistive effect element.

According to a second aspect of the present invention, a method for producing a magnetic memory device, comprises: forming a magnetoresistive effect element; forming a first insulating film so as to cover the magnetoresistive effect element; forming a coating film so as to cover the first insulating film; exposing a top face of the magnetoresistive effect element by removing the coating film and first insulating film on the magnetoresistive effect element; forming an upper writing line, which is electrically connected to the top face of the magnetoresistive effect element, on the magnetoresistive effect element; exposing the first insulating film on a side portion of the magnetoresistive effect element by removing a part or all of the coating film; and forming a yoke structural member so as to cover at least a side portion of the upper writing line and so as to contact the exposed first insulating film on the side portion of the magnetoresistive effect element.

According to a third aspect of the present invention, a method for producing a magnetic memory device, comprises: forming a selecting transistor on a semiconductor substrate; forming a lower writing line; forming a magnetoresistive effect element, a bottom end of which is electrically connected to the lower writing line, on the lower writing line; forming a first insulating film so as to cover the magnetoresistive effect element; forming a coating film so as to cover the first insulating film; exposing a top face of the magnetoresistive effect element by removing the coating film and first insulating film on the magnetoresistive effect element; etching the coating film so that a surface of the coating film is lower than the top face of the magnetoresistive effect element; forming a connecting line which is electrically connected to one of a source and drain of the selecting transistor via a connecting plug and which is electrically connected to the top face of the magnetoresistive effect element; forming a second insulating film serving as an interlayer dielectric film so as to cover the connecting line; forming an upper writing line, which crosses the lower writing line, on the second insulating film so as to cover the connecting line; partially removing the second insulating film to allow the second insulating film to remain below the upper writing line and around the connecting line; exposing the first insulating film on a side portion of the magnetoresistive effect element by removing a part or all of the coating film; and forming a yoke structural member so as to cover at least a side portion of the upper writing line and so as to contact the exposed first insulating film on the side portion of the magnetoresistive effect element.

BRIEF DESCRIPTION OF THE DRAWINGS

FIG. 3A is a plan view of a memory cell of a magnetic memory device produced by the producing method according to the first embodiment, and FIGS. 3B and 3C are sectional views showing the memory cell of the magnetic memory device produced by the producing method according to the first embodiment;

FIGS. 4A and 4B are sectional views showing a modified example of the first embodiment;

DESCRIPTION OF THE EMBODIMENTS

Referring now to the accompanying drawings, the embodiments of the present invention will be described below.

First Embodiment

Referring to FIGS. 1A through 3C, the first embodiment of a method for producing a magnetic memory device according to the present invention will be described below. FIGS. 1A through 2B are sectional views showing producing steps in the vicinity of a memory cell portion produced by the first embodiment of a method for producing a magnetic memory device according to the present invention. As shown in FIG. 3A, a magnetic memory device produced in this embodiment has a simple matrix type architecture wherein TMR elements 20 are arranged so as to be electrically connected to writing lines between crossing two writing lines, i.e. a word line 10 and a bit line 40. This architecture can extremely enhance density since each memory cell is provided with only TMR elements 20 and no selecting cell transistors for selecting the memory cell.

Figure 1A:
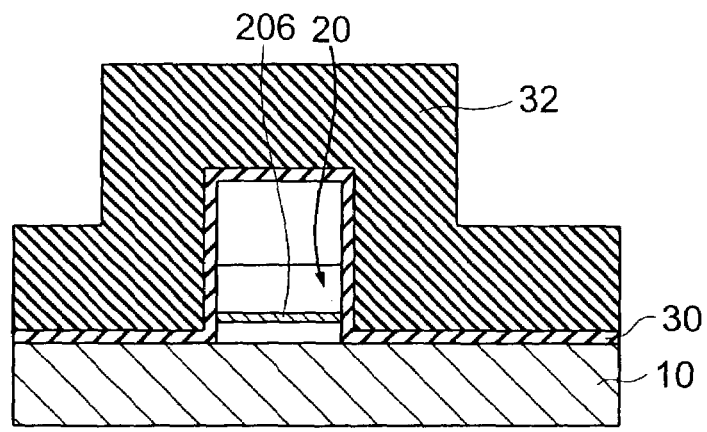
FIGS. 1A through 1C are sectional views showing producing steps of the first embodiment of a method for producing a magnetic memory device according to the present invention.

The vicinity of a memory cell produced by the first embodiment of a method for producing a magnetic memory device according to the present invention is formed as follows. First, as shown in FIG. 1A, writing word lines 10 are formed, and subsequently, TMR elements 20 are formed on the writing word lines 10. It is considered that the material of the writing word lines 10 is Al, Al—Cu, Cu, Ag or the like. In this embodiment, the material of the writing word lines 10 is Cu, and is formed by the damascene method. As shown in FIG. 3C, the writing word line 10 is a line with yoke which is covered with a ferromagnetic film 14 of NiFe. Between the writing word line 10 and the ferromagnetic film 14, a barrier metal 12 of CoFe is provided. Outside of the ferromagnetic film 14, a film (not shown) of TiN is provided.

Figure 9:
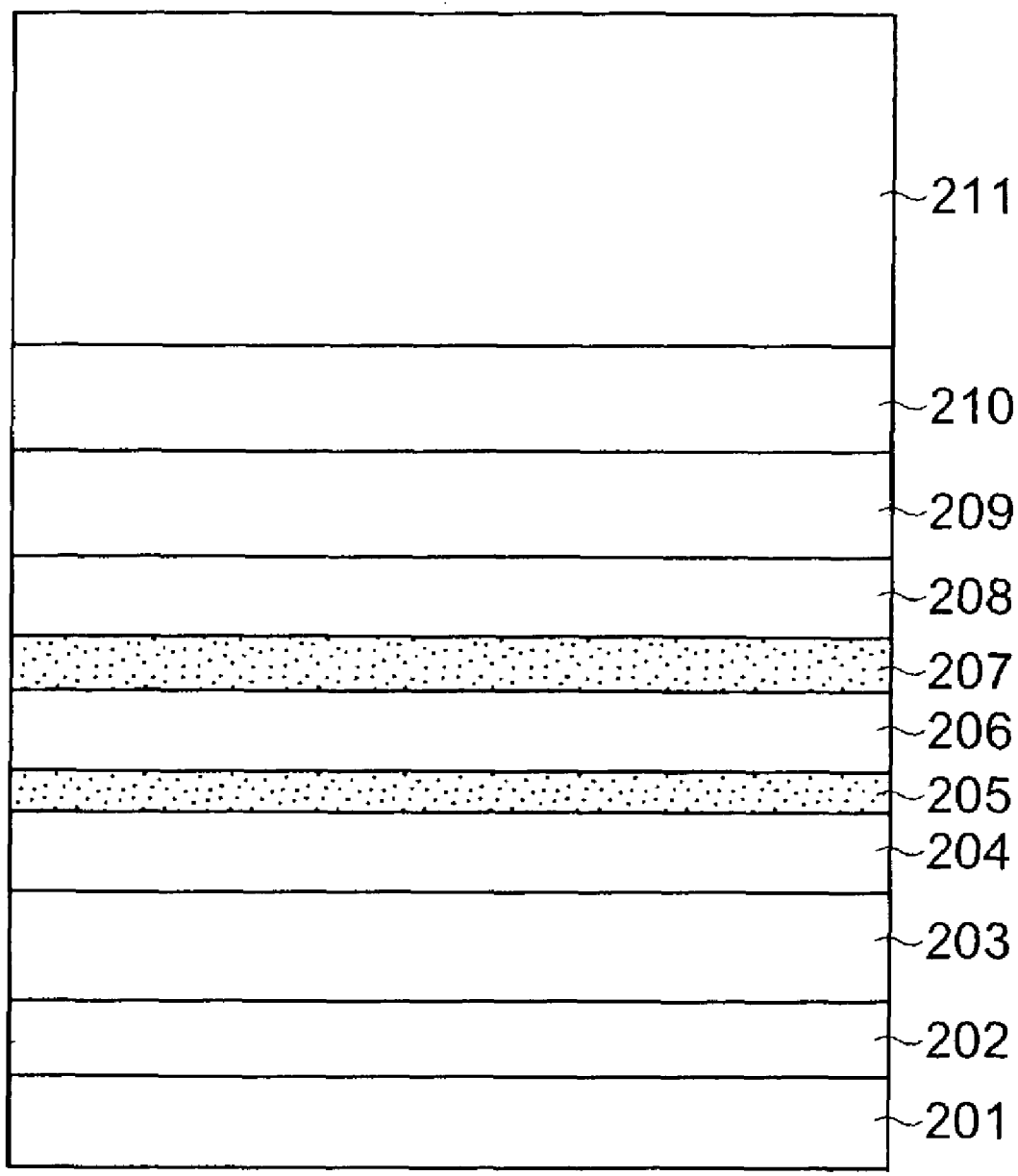
FIG. 9 is a sectional view showing the architecture of a TMR element for use in a embodiment of the present invention.

The TMR element 20 is prepared by etching a TMR laminated film structure, which is formed by the high vacuum sputtering, so as to have a predetermined shape. The TMR laminated film structure is a ferromagnetic double tunnel junction element having double tunnel junction portions 205 and 207 as shown in FIG. 9. That is, the TMR laminated film structure comprises a lower line connecting layer 201 of Ta, a buffer layer 202 of Ru, a first antiferromagnetic layer 203 of Ir—Mn, a first magnetization fixed layer 204 of $Co_6Fe_4$, a first tunnel barrier layer 205 of $Al_2O_3$, a storage layer 206 of $Co_3Fe_4Ni_3$ having a thickness of 2 nm, a second tunnel barrier layer 207 of $Al_2O_3$, a second magnetization fixed layer 208 of $Co_6Fe_4$, a second antiferromagnetic layer 209 of Ir—Mn, an etching stop/surface protective layer 210 of Ru, and an etching mask/top connecting layer 211 of Ta.

Then, referring to FIG. 1A again, an insulating film 30 of, e.g. SiNx (silicon nitride), having a thickness of 50 nm is formed so as to cover the TMR element 20, and a coating film 32 of, e.g. SiOx (silicon oxide), having a thickness of 200 nm is formed so as to cover the insulating film 30. Furthermore, in FIGS. 1A through 2B, only the storage layer 206 of the TMR laminated film structure 20 is symbolically shown, and the details of other layers of the laminated structure are simplified to be shown.

Figure 1B:
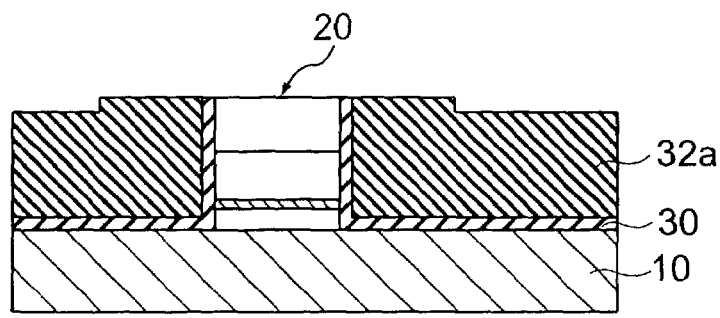

Then, as shown in FIG. 1B, the coating film 32 and insulating film 30 are removed to be flattened by, e.g., the CMP (Chemical Mechanical Polishing) method, so as to expose a top connecting layer 27 of the TMR element 20. As a result, the coating film 32a is buried around the TMR element 20. Furthermore, the etch back method may be substituted for the CMP.

Figure 1C:
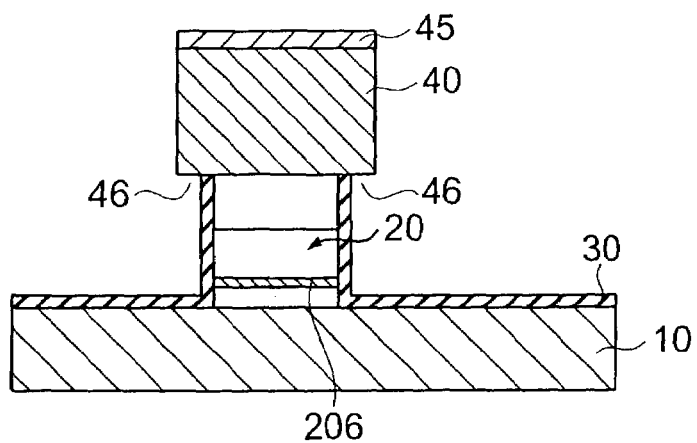

Then, a writing bit line 40 is formed so as to be connected to the top connecting layer of the TMR element 20, and a film 45 of, e.g. NiFe, is stacked on the uppermost layer of the writing bit line 40. Furthermore, the writing bit line 40 and the NiFe film 45 are formed by stacking a wiring material film, which is to be formed as the writing bit line 40, and the NiFe film thereon and by patterning them. Thereafter, as shown in FIG. 1C, the writing bit line 40 and the NiFe film 45 are used as masks for etching and removing the coating film 32 of SiOx so that the insulating film 30 of SiNx on the side of the TMR element 20 is exposed. It is considered that the etching method is, e.g. a method wherein the RIE (Reactive Ion Etching) method using $CHF_3$ is used, and subsequently, a dilute HF solution is used. A state that this etching is completed is shown in FIG. 1C. In this state, if the writing bit line 40 is larger than the TMR element 20 covered with the insulating film 30, a cavity 46 is formed below the writing bit line 40 on the side of the TMR element as shown in FIG. 1C. At this time, as shown in FIG. 3C, the coating film 32a of SiOx may remain in a region excluding the TMR element 20 below the writing bit line 40, i.e. a region 46a between adjacent TMR elements 20 in directions in which the writing bit line 40 extends. The reason for this is that the writing bit line 40 is supported on the remaining coating film 32a without completely causing the region 46a between adjacent TMR elements 20 to become hollow.

Furthermore, in this embodiment, the top face of the TMR element 20 is not damaged in the producing process since the writing bit line 40 is formed so as to have a greater width than that of the TMR element 20, i.e. so as to cover the top face of the TMR element 20.

Figure 2A:
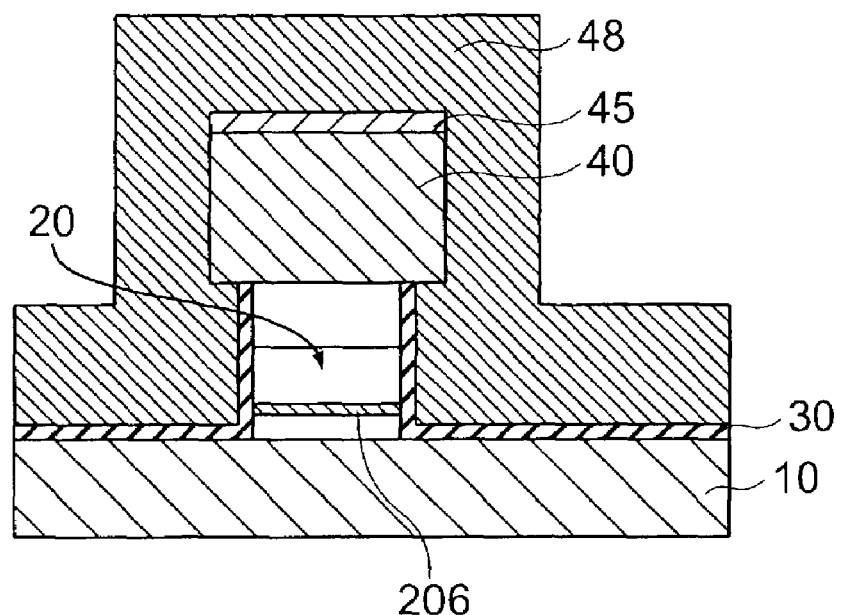
FIGS. 2A and 2B are sectional views showing producing steps of the first embodiment of a method for producing a magnetic memory device according to the present invention.

Then, as shown in FIG. 2A, a ferromagnetic film 48 of, e.g. NiFe, is formed so as to cover the insulating film 30 serving as side walls of the writing bit line 40 and TMR element 20. At this time, the ferromagnetic film 48 has been deposited so as to be filled in the cavity 46 formed below the writing bit line 40 in FIG. 1C. Methods capable of forming such a shape include, e.g. the CVD (Chemical Vapor Deposition) method, the plating method, the atomic layer deposition (ALD) method and so forth. If the cavity 46 is small, i.e. if the width of the cavity 46 in FIG. 1C is smaller than about ⅓ of its height, the sputtering method may be used.

Figure 2B:
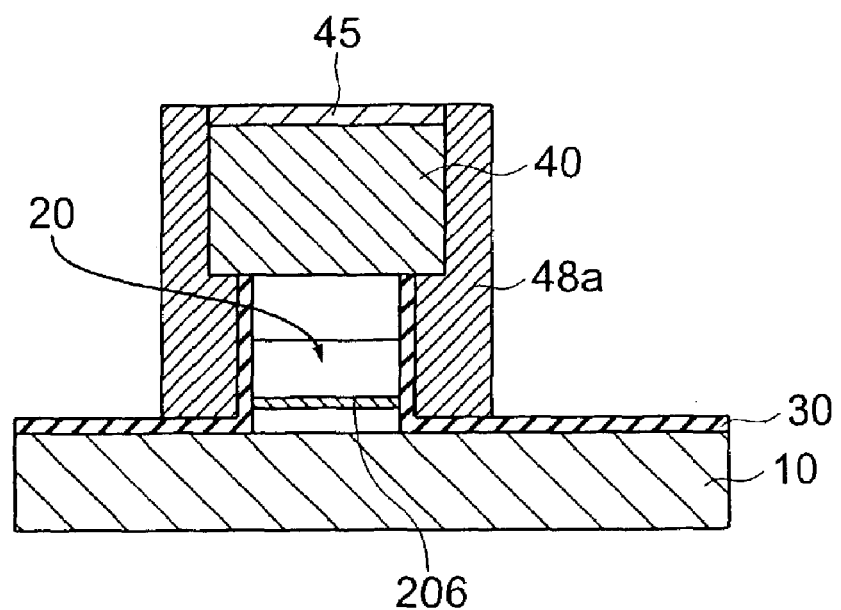

Then, as shown in FIG. 2B, the ferromagnetic film 48 around the writing bit line 40 and on the side of the TMR element 20 is etched back to be removed by the anisotropic etching, such as ion milling, to form a yoke 48a.

Furthermore, in place of a single layer comprising the ferromagnetic film 48, a laminated structure having a barrier metal, which is formed by depositing a non-magnetic metal, such as Ta, Ti, TiN, TaN, W or WN, before depositing the ferromagnetic film 48, may be formed. For example, as shown in FIG. 4A, a non-magnetic metal film 47 is formed before the ferromagnetic film 48 is formed, and thereafter, the ferromagnetic film 48 is formed to be etched back to form the yoke 48a (see FIG. 4B). That is, the yoke structural member comprises the yoke 48a and the non-magnetic metal film 47. At this time, it is not required to form the non-magnetic metal film 47 and the ferromagnetic film 48 by the same deposition method. For example, the non-magnetic metal film 47 of TiN may be formed by the CVD method, and the ferromagnetic film 48 of NiFe may be formed by the plating method.

In a magnetic memory device thus formed, even if the writing bit line 40 formed on the top of the TMR element 20 is displaced, the distance between the yoke 48a and the TMR element 20 is determined by the thickness of the insulating film 30 of SiNx, so that the distance between any one of the TMR element 20 and the yoke 48a is constant and a very small distance of 50 nm. Therefore, the variation in switching current can be reduced to be half.

While the material of the ferromagnetic film to be formed as the yoke 48a has been NiFe in the above described embodiment, it may be suitably a general high permeability material which is selected from Fe, Fe—Al alloys, Fe—Si alloys, Fe—Si—Al alloys, such as Sendust, NiFe alloys, a soft ferrite containing Fe2O3 alloy as a principal component, and amorphous alloys of Fe, Co or Ni and B, Si or P, and preferably has a relative magnetic permeability greater than 10.

While the yoke film 45 of NiFe has been formed on the top face of the writing line 40 in this embodiment, the yoke film 45 may be formed of another ferromagnetic material in place of NiFe. It is not always required to form the yoke film 45. In this case, the yoke 48a is formed only on the side of the writing line 40. The film 45 may be formed of an insulating material in place of the yoke material.

Furthermore, in this embodiment, the writing word line 10 and the writing word line 40 also serve as reading lines.

Second Embodiment

Referring to FIGS. 5A through 7B, the second embodiment of a method for producing a magnetic memory device according to the present invention will be described below. FIGS. 5A through 7B are sectional views showing producing steps in the vicinity of a memory cell portion of a magnetic memory device produced by the producing method in the second embodiment. As shown in FIGS. 8A through 8C, the magnetic memory device produced in this embodiment has one transistor-one TMR cell type architecture wherein one memory cell portion is provided between crossing two writing lines, i.e. a word line 10 and a bit line 40, the memory cell portion comprising one selecting transistor and one TMR element. Since this memory cell portion is provided with the selecting transistor, the access time to access a memory cell is short, so that a rapid access can be achieved. On end of the TMR element 20 is connected to the writing word line 10, and the other end thereof is connected to a drain 66b of a selecting transistor 66 via a local line 36 and connecting plug 60 in cell. A gate 66a of the selecting transistor 66 is used for reading data out of the memory cell. The writing bit line 40 is provided on the local line 36 in cell via an insulating film (not shown) to be covered with a yoke 50. The writing word line 10 is also covered with a yoke 16.

Figure 5A:
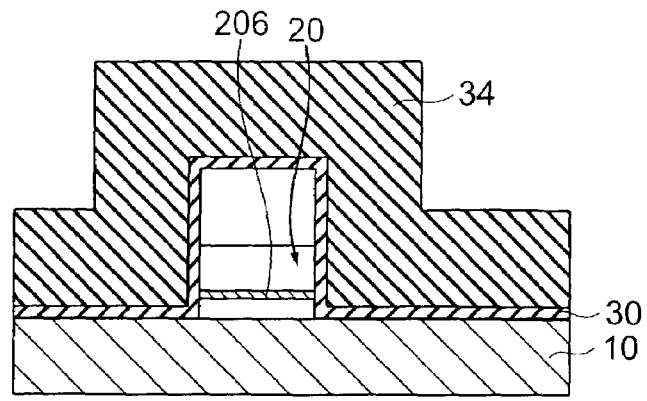
FIGS. 5A through 5D are sectional views showing producing steps of the second embodiment of a method for producing a magnetic memory device according to the present invention.

The memory cell portion of a magnetic memory device produced by the producing method in this second embodiment is formed as follows. First, as shown in FIG. 5A, a writing word line 10 is formed of Cu coated with a yoke (not shown) of NiFe, and subsequently, a TMR element 20 is formed on the writing word line 10. This writing word line 10 is formed by the damascene method. As a barrier metal, a film (not shown) of TiN is provided outside of the yoke of NiFe, and a film (not shown) of CoFe is provided between the yoke of NiFe and the writing word line 10. The TMR element 20 is a ferromagnetic double tunnel junction element having the same construction as that in the first embodiment, and is prepared by etching a TMR laminated film structure, which is formed by the high vacuum sputtering method, so as to have a predetermined shape.

Then, as shown in FIG. 5A, an insulating film 30 of SiNx having a thickness of 30 nm is formed so as to cover the writing word line 10 and TMR element 20, and an insulating film 34 of diamond-like carbon (which will be also hereinafter referred to as DLC) having a thickness of 200 nm is formed so as to cover the insulating film 30. Furthermore, in FIG. 5A, only the storage layer 206 of the TMR element 20 is symbolically shown, and the details of other layers of the laminated structure are simplified to be shown.

Figure 5B:
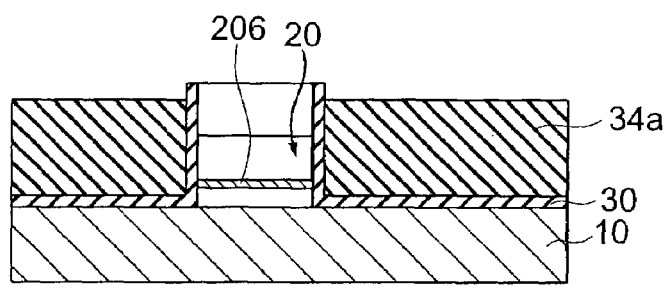

Then, as shown in FIG. 5B, the insulating film 34 of DLC and the insulating film 30 of SiNx are removed by, e.g. the CMP method, so that the top connecting layer of the TMR element 20 is exposed. Thereafter, the insulating film 34 is etched so that the surface of the insulating film 34 is lower than the top end face of the exposed TMR laminated structure by 20 nm (see FIG. 5B). FIG. 5B shows an etched insulating film 34a.

Figure 5C:
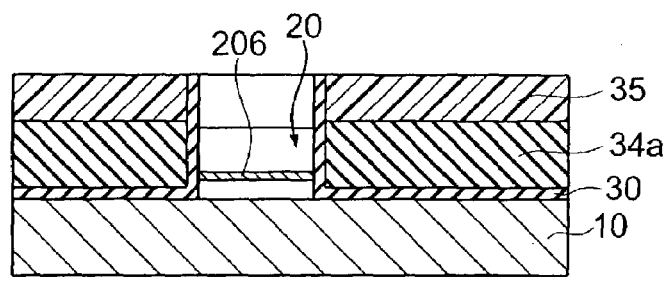
Figure 5D:
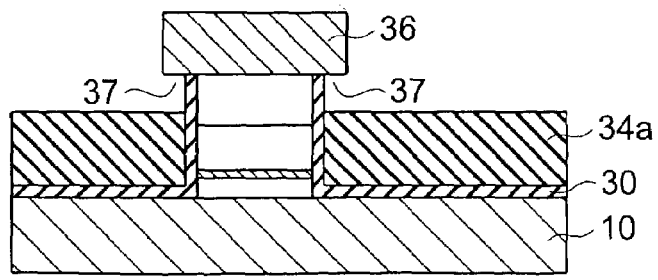

Then, a novolak resin having a thickness of 100 nm is applied on the whole surface by the rotational coating method to form a spacer layer 35. Moreover, the top connecting layer of the TMR element 20 is exposed again by the etch back method. Then, as shown in FIG. 5C, the spacer layer 35 of the novolak resin is formed on only the insulating film 34a. Then, a connecting plug 60 is completed by a usual semiconductor manufacturing process. Then, the local line 36 in cell is formed so as to be connected to the top connecting layer 24 of the TMR element 20 and the connecting plug 60. Thereafter, the spacer layer 35 is removed to expose the insulating film 34a, so that a cavity 37 is formed below the local line 36 in cell (see FIG. 5D).

Figure 6A:
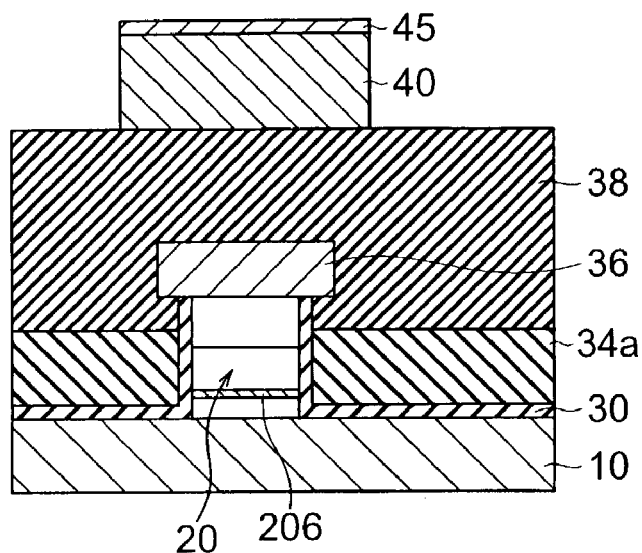
FIGS. 6A through 6C are sectional views showing producing steps of the second embodiment of a method for producing a magnetic memory device according to the present invention.

Then, as shown in FIG. 6A, an interlayer dielectric film 38 of $SiO_2$ having a thickness of 300 nm is deposited by the plasma CVD method, and a writing bit line 40 is formed on the interlayer dielectric film 38. A film 45 of NiFe has been deposited on the uppermost layer of the writing bit line 40.

Figure 6B:
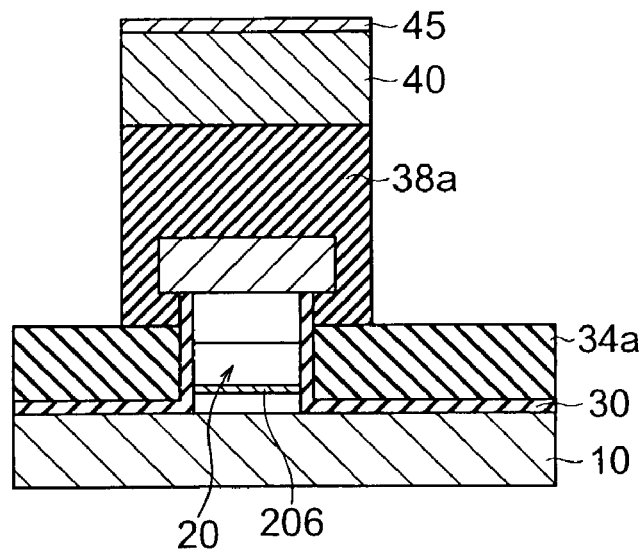

Then, as shown in FIG. 6B, the writing bit line 40 is used as a mask for etching the interlayer dielectric film 38 of $SiO_2$ by, e.g. the RIE (Reactive Ion Etching) method using $CHF_3$, so as to expose an insulating film 34 of DLC, to form a pattern 38a.

Figure 6C:
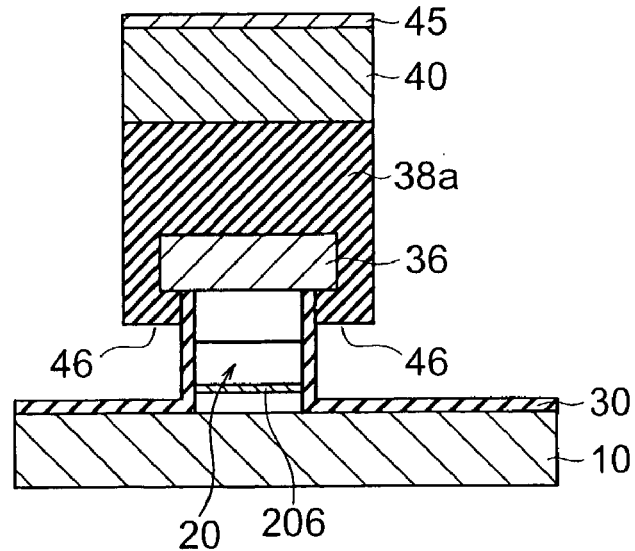

Then, as shown in FIG. 6C, the insulating film 34a of DLC is removed by the oxygen ashing method to expose the insulating film 30 of SiNx on the side wall of the TMR element 20. At this time, a cavity 46 is formed below the pattern 38a.

Figure 7A:
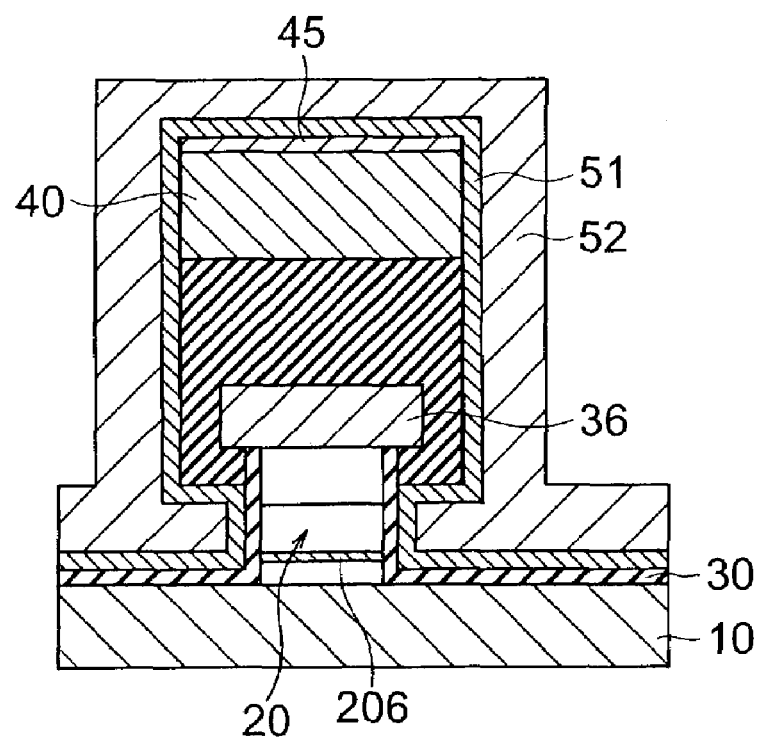
FIGS. 7A and 7B are sectional views showing producing steps of the second embodiment of a magnetic memory device according to the present invention.
Figure 8A:
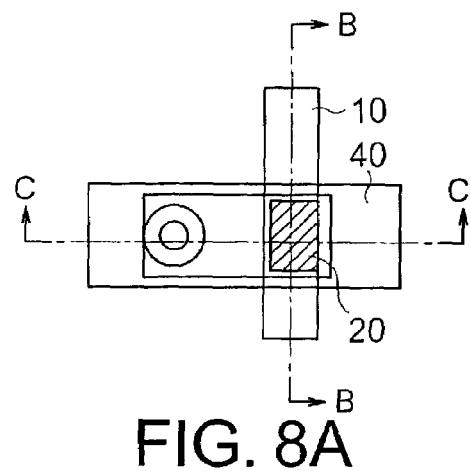
FIG. 8A is a plan view of a memory cell of a magnetic memory device produced by the producing method according to the second embodiment.
Figure 8B:
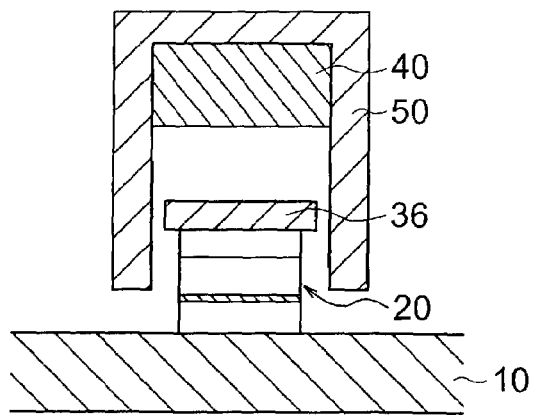
FIGS. 8B and 8C are sectional views showing the memory cell of the magnetic memory device produced by the producing method according to the second embodiment.
Figure 8C:
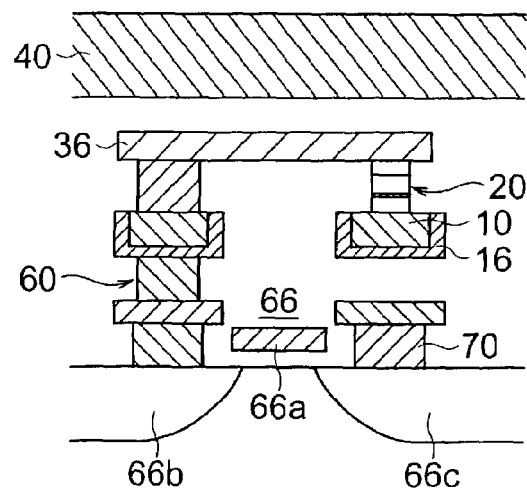

Then, in order to form a yoke structural member, as shown in FIG. 7A, a W layer 51 to be formed as a barrier metal layer is deposited by, e.g. the CVD method, so as to cover the side walls of the writing bit line 10 and TMR element 20, and subsequently, an NiFe layer 52 being a ferromagnetic layer is deposited by, e.g. the plating method. As this time, the W layer 51 and the NiFe layer 52 are deposited so as to be filled in the cavity 46 formed below the pattern 38a in FIG. 6C (see FIG. 7A). That is, in this embodiment, the yoke 50 (see FIG. 8B) formed so as to cover the writing bit line 40 has a double layer structure comprising the W layer 51 and NiFe layer 52.

Figure 7B:
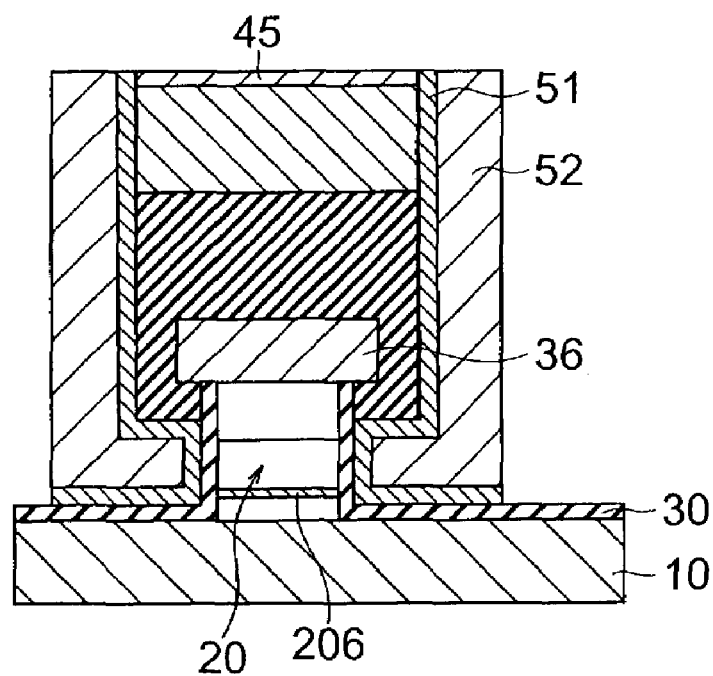

Then, as shown in FIG. 7B, the W layer 51 and NiFe layer 52 excluding the surrounding portion of the writing bit line 10 and the wide wall of the TMR element 20 are etched back to be removed by the ion milling. Thus, the vicinity of the TMR element 20 in the memory cell portion is completed. This TMR element 20 is connected to the drain 66b of the cell transistor 66, which is formed on a silicon substrate and which is shown in FIG. 8C, via the local line 36 in cell and the connecting plug. Each writing line is connected to a driver and sinker which are formed outside of the memory cell array region.

In a magnetic memory device thus formed, even if the writing bit line 40 formed on the top of the TMR element 20 is displaced, the distance between the yoke 51, 52 and the TMR element 20 is determined by the thickness of the insulating film 30 of SiNx, so that the distance between the TMR element 20 and the yoke 51, 52 in any memory cells is constant and a very small distance of 30 nm. Therefore, the variation in switching current can be reduced to be ⅔.

While the material of the ferromagnetic film to be formed as the yoke 48a has been NiFe in the above described embodiment, it may be suitably a general high permeability material which is selected from Fe, Fe—Al alloys, Fe—Si alloys, Fe—Si—Al alloys, such as Sendust, NiFe alloys, a soft ferrite containing Fe2O3 alloy as a principal component, and amorphous alloys of Fe, Co or Ni and B, Si or P, and preferably has a relative magnetic permeability greater than 10.

While the yoke film 45 of NiFe has been formed on the top face of the writing line 40 in this embodiment, the yoke film 45 may be formed of another ferromagnetic material in place of NiFe. It is not always required to form the yoke film 45. In this case, the yoke 51 is formed only on the side of the writing line 40. The film 45 may be formed of an insulating material in place of the yoke material.

Furthermore, in this embodiment, the writing word line 10 also serves as reading line.

Third Embodiment

Figure 10:
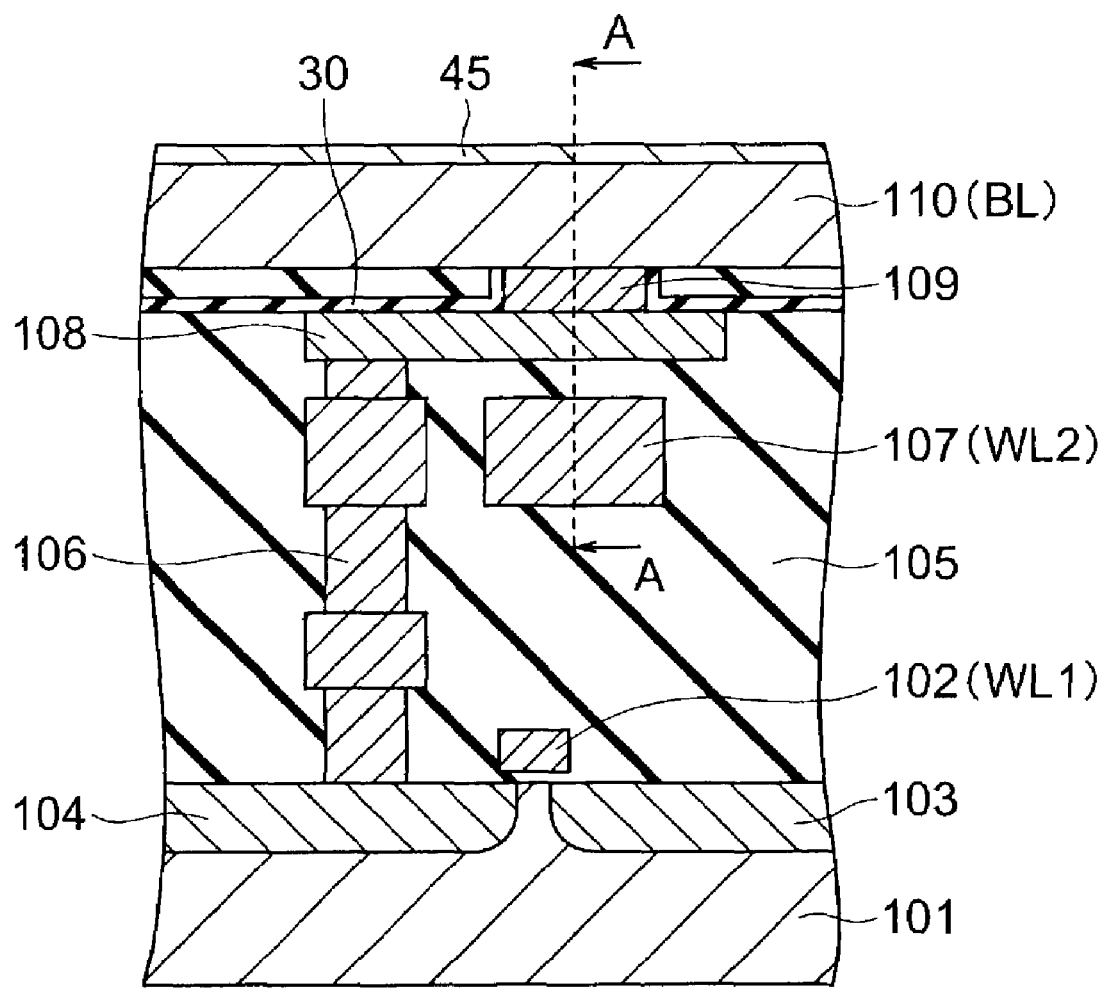
FIG. 10 is a sectional view showing a memory cell of a magnetic memory device produced by the third embodiment of a producing method according to the present invention.
Figure 11:
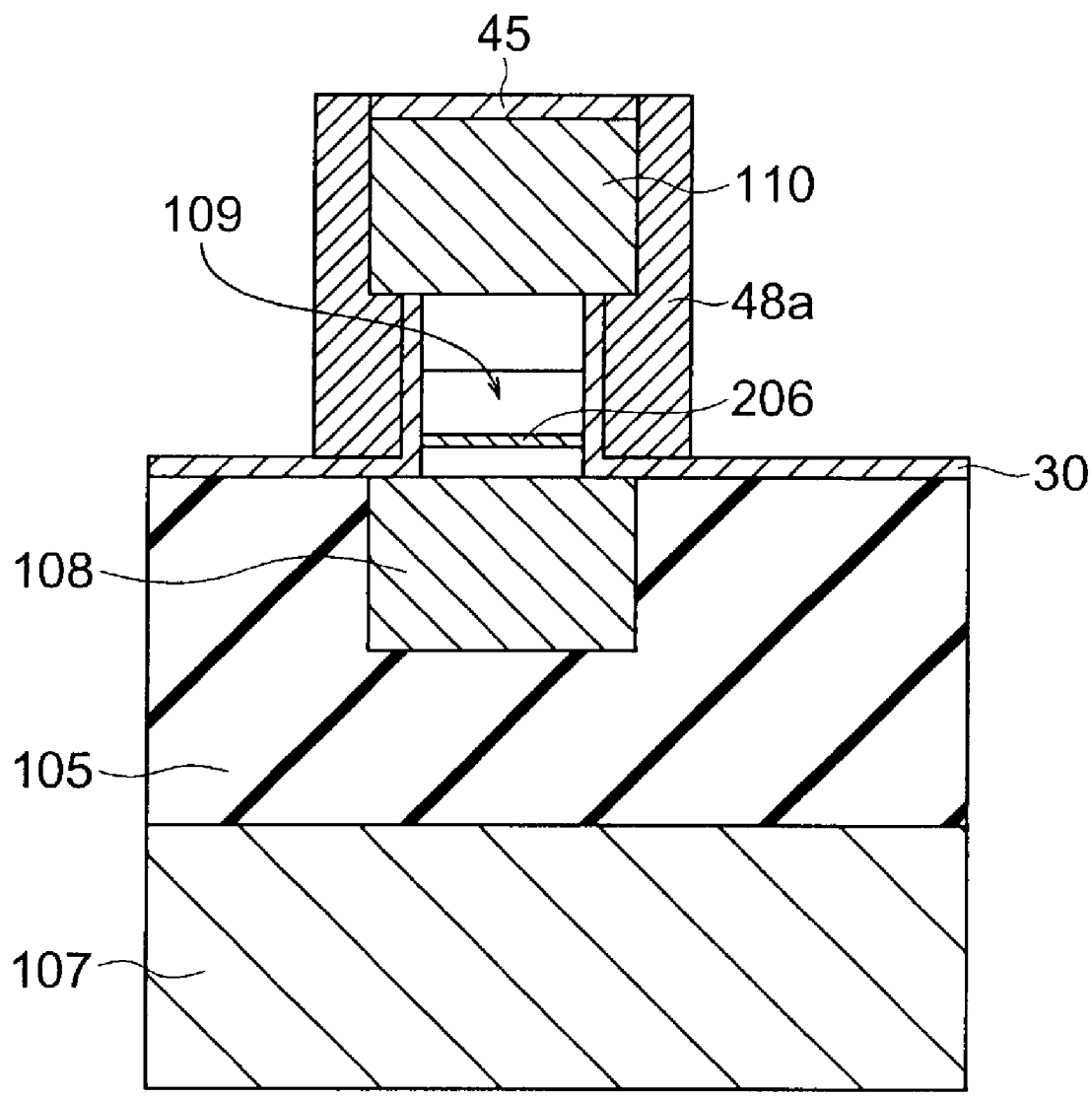
FIG. 11 is a sectional view taken along line A—A of FIG. 10.
Figure 12A:
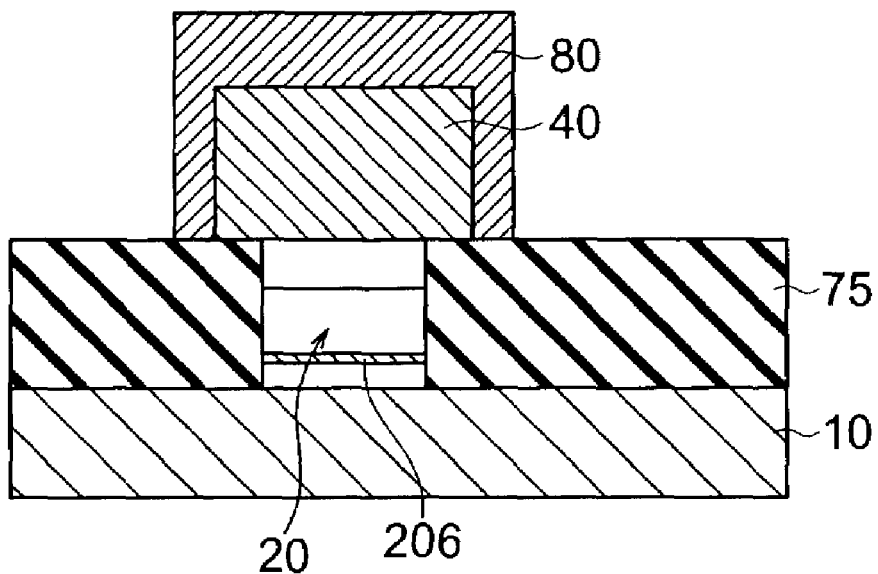
FIGS. 12A and 12B are sectional views showing amemory cell portion of a conventional magnetic memory device.
Figure 12B:
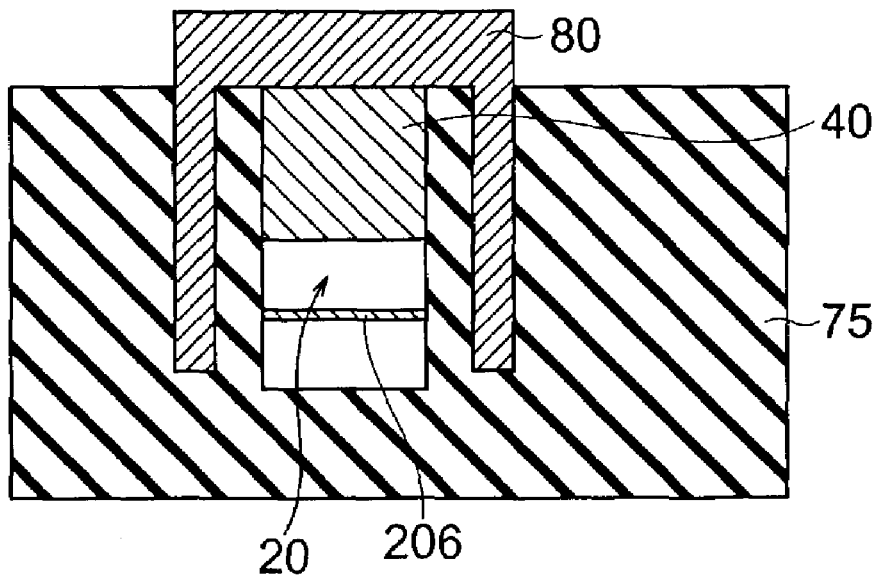

Referring to FIGS. 10 and 11, the third embodiment of a method for producing a magnetic memory device according to the present invention will be described below. In FIG. 10, a gate electrode 102 is formed on a silicon substrate 101. Thereafter, source/drain regions 103 and 104 are formed on the surface of the silicon substrate 101 on both sides of the gate electrode 102. By the gate electrode 102 and source/drain regions 103 and 104, a selecting transistor is formed. Furthermore, the gate electrode 102 extends in directions perpendicular to the plane of the figure, and is used as a word line (WL1).

Subsequently, an insulating layer is formed on the whole surface of the silicon substrate 102. In this insulating layer, a connecting plug 106 connected to the drain region 104 of the selecting transistor, and a word line (WL2) extending in directions perpendicular to the plane of the figure are formed. Thereafter, an underlying electrode 108 connected to the connecting plug 106 is formed, and then, a TMR element 109 which is arranged above the word line (WL2) 107 and which is connected to the underlying electrode 108 is formed (see FIG. 10).

Subsequently, the same producing steps as those of the producing method in the first embodiment shown in FIGS. 1A through 2B are carried out to form a bit line 110 on the top face of the TMR element 109 and to form a yoke 48a on the side of the bit line 110 (see FIG. 11). At this time, the yoke 48a is also formed on the side of the TMR element 109 via the insulating film 30. A yoke film 45 of NiFe is formed on the top of the bit line 110. The bit line 110 extends in directions substantially perpendicular to the word line (WL2) 107. The TMR element 109 has the same construction as that of the TMR element 20. Thereafter, an insulating film is formed so as to cover the yoke 48a and yoke 45, so that a magnetic memory device is completed.

As shown in FIG. 10, the magnetic memory device produced in this embodiment has the word line (WL2) extending in directions perpendicular to the plane of the figure, the bit line 110 extending above the word line (WL2) 107 in directions substantially perpendicular thereto, and the TMR element 109 provided between the word line (WL2) 107 and the bit line 110. A writing operation into the TMR element 109 is carried out by causing writing current to pass through the word line (WL2) 107 and bit line 110 to produce a magnetic field due to current and by inverting the magnetization of the magnetization free layer of the TMR layer 109 by a synthesized magnetic field of both. A reading operation is carried out by turning the selecting transistor on to cause a sense current to pass through the TMR element 109 between the underlying electrode 108 and bit line 110 to measure the change of tunneling resistance. That is, in this embodiment, the bit line 110 also serves as a reading line.

Also in the magnetic memory device thus formed in this embodiment, even if the writing bit line 110 formed on the top of the TMR element 109 is displaced, the distance between the yoke 48a and the TMR element 109 is determined by the thickness of the insulating film 30 of SiNx, so that the distance between any one of the TMR element 109 and the yoke 48a is constant and a very small distance of 50 nm as shown in FIG. 11. Therefore, the variation in switching current can be reduced to be half.

While the material of the ferromagnetic film to be formed as the yoke 48a has been NiFe in the above described embodiment, it may be suitably a general high permeability material which is selected from Fe, Fe—Al alloys, Fe—Si alloys, Fe—Si—Al alloys, such as Sendust, NiFe alloys, a soft ferrite containing Fe2O3 alloy as a principal component, and amorphous alloys of Fe, Co or Ni and B, Si or P, and preferably has a relative magnetic permeability greater than 10.

While the first insulating film has been formed of SiNx in the first through third embodiment, it may be formed of SiOx (silicon oxide), SiOxNy (silicon oxynitride), AlOx (aluminum oxide), AlN (aluminum nitride), AlOxNy (aluminum oxynitride) or the like. The second insulating film has been formed of a resist of a resin or the like. The points in selection from these materials are that the coating film 32 can be selectively etched and removed from the insulating film directly covering the TMR element and that the writing bit line 40 does not erode during the etching. As such a combination other than that in the above described embodiment, there is a method using a general insulating material, such as silicon oxide, silicon nitride or alumina, as the material of the insulating film 30, using a novolak resin as the material of the coating film 32, using an Al—Cu alloy sandwiched between barrier metals, such as TiN, as the material of the writing bit line 40, and etching the coating film 32 of the novolak resin by the oxygen ashing method using oxygen plasma. There is also a method using silicon oxide or alumina as the material of the insulating film 30, using silicon nitride as the material of the coating film 32, using an Al—Cu alloy sandwiched between barrier metals, such as TiN, as the material of the writing bit line 40, and etching the coating film of silicon nitride by the isotropic chemical dry etching using $CF_4$ or the like. The coating film 32 may be formed of an insulating material or a conductive material if it is completely removed. For example, there is also a method using Ti or the like as the material of the coating film 32 which is removed by an ammonia/hydrogen peroxide solution. In this case, as the barrier metal for the writing bit line 40, Ti can not be used, and a material insoluble in the ammonia/hydrogen peroxide solution, e.g. Ta or TaN, is preferably used.

While the local line in cell has been connected to the selecting transistor via the connecting plug in the above described second and third embodiments, the present invention can be applied to a case where no selecting transistor is provided, or a case where a local line is provided from the top end face of the TMR element to a read only line. Moreover, the local line and the connecting plug can be integrally formed by one layer.

Furthermore, in the first embodiment, a diode may be provided between two writing lines in series to the TMR element.

While the yoke film 45 of NiFe has been formed on the top face of the writing line 110 in this embodiment, the yoke film 45 may be formed of another ferromagnetic material in place of NiFe. It is not always required to form the yoke film 45. In this case, the yoke 48a is formed only on the side of the writing line 110. The film 45 may be formed of an insulating material in place of the yoke material.

As described above, according to the present invention, even if the alignment of the writing bit line with the TMR element 20 is displaced, the distance between the yoke and the TMR element can be shorter. Thus, it is possible to suppress the variation in switching current passing through the writing line, so that it is possible to obtain a high density magnetic memory device at a good yield rate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A method for producing a magnetic memory device, the method comprising:
    forming a magnetoresistive effect element; forming a first insulating film so as to cover the magnetoresistive effect element;
    forming a coating film so as to cover the first insulating film;
    exposing a top face of the magnetoresistive effect element;
    forming an upper writing line above the magnetoresistive effect element;
    exposing the first insulating film on a side portion of the magnetoresistive effect element by removing a part or all of the coating film; and
    forming a yoke structural member, after forming the upper writing line and after exposing the first insulating film, so as to cover at least a side portion of the upper writing line and the side portion of the magnetoresistive effect element to sandwich the exposed first insulating film between the yoke structural member and the side portion of the magnetoresistive effect element.

2. A method for producing a magnetic memory device as set forth in claim 1, wherein the magnetic memory device has a memory cell having a simple matrix architecture.

3. A method for producing a magnetic memory device as set forth in claim 1, which further comprising fonning a lower line before forming the magnetoresistive effect element and wherein a top face of the lower line is electrically connected to a bottom face of the magnetoresistive effect element.

4. A method for producing a magnetic memory device as set forth in claim 1, which thrther comprises:
    forming a selecting transistor; and
    forming a connecting line which is connected to one of a source and drain of the selecting transistor via a connecting plug and which is electrically connected to a bottom end of the magnetoresistive effect element.

5. A method for producing a magnetic memory device as set forth in claim 1, wherein the step of forming the yoke structural member comprising:
    forming a first yoke made of a first yoke material on a top face of the upper writing line;
    depositing a second yoke material so as to cover the first yoke and the upper writing line and so as to contact the exposed first insulating film; and
    partially removing a film of the deposited second yoke material to leave the film on at least the side portion of the upper writing line and on the exposed first insulating film to form a second yoke.

6. A method for producing a magnetic memory device as set forth in claim 1, wherein the step of forming the yoke structural member comprising:
    depositing a yoke material so as to cover the upper writing line and so as to contact the exposed first insulating film; and
    partially removing a film of the deposited yoke material to leave the film on at least the side portion of the upper writing line and on the exposed first insulating film.

7. A method for producing a magnetic memory device as set forth in claim 6, wherein the yoke structural material comprises a barrier metal layer of at least one layer, and at least one ferromagnetic layer.

8. A method for producing a magnetic memory device as set forth in claim 1, wherein the magnetoresistive effect element is a tunnel junction type magnetoresistive effect element comprising at least one storage layer, at least one magnetization fixed layer, and at least one tunnel burner layer.

9. A method for producing a magnetic memory device, the method comprising:
    forming a magnetoresistive effect element; forming a first insulating film so as to cover the magnetoresistive effect element;
    forming a coating film so as to cover the first insulating film;
    exposing a top face of the magnetoresistive effect element by removing the coating film and first insulating film on the magnetoresistive effect element;
    forming an upper writing line, which is electrically connected to the top face of the magnetoresistive effect element, above the magnetoresistive effect element;
    exposing the first insulating film on a side portion of the magnetoresistive effect element by removing a part or all of the coating film; and
    forming a yoke structural member, after forming the upper writing line and after exposing the first insulating film, so as to cover at least a side portion of the upper writing line and so as to contact the exposed first insulating film on the side portion of the magnetoresistive effect element to sandwich the exposed first insulating film between the yoke structural member and the side portion of the magnetoresistive effect element.

10. A method for producing a magnetic memory device as set forth in claim 9, which further comprising forming a lower line before forming the magnetoresistive effect element and wherein a top face of the lower line is electrically connected to a bottom face of the magnetoresistive effect element.

11. A method for producing a magnetic memory device as set forth in claim 9, wherein the magnetic memory device has a memory cell having a simple matrix architecture.

12. A method for producing a magnetic memory device as set forth in claim 9, which further comprises:
    forming a selecting transistor; and
    forming a connecting line which is connected to one of a source and drain of the selecting transistor via a connecting plug and which is electrically connected to a bottom end of the magnetoresistive effect element.

13. A method for producing a magnetic memory device as set forth in claim 9, wherein the step of forming the yoke structural member comprising:
    forming a first yoke made of a first yoke material on a top face of the upper writing line;
    depositing a second yoke material so as to cover the first yoke and the upper writing line and so as to contact the exposed first insulating film; and
    partially removing a film of the deposited second yoke material to leave the film on at least the side portion of the upper writing line and on the exposed first insulating film to form a second yoke.

14. A method for producing a magnetic memory device as set forth in claim 9, wherein the step of forming the yoke structural member comprising:
    depositing a yoke material so as to cover the upper writing line and so as to contact the exposed first insulating film; and
    partially removing a film of the deposited yoke material to leave the film on at least the side portion of the upper writing line and on the exposed first insulating film.

15. A method for producing a magnetic memory device as set forth in claim 14, wherein the yoke structural material comprises a barrier metal layer of at least one layer, and at least one ferromagnetic layer.

16. A method for producing a magnetic memory device as set forth in claim 9, wherein the magnetoresistive effect element is a tunnel junction type magnetoresistive effect element comprising at least one storage layer, at least one magnetization fixed layer, and at least one tunnel burner layer.

17. A method for producing a magnetic memory device, the method comprising:
    forming a selecting transistor on a semiconductor substrate;
    forming a lower writing line;
    forming a magnetoresistive effect element, a bottom end of which is electrically connected to the lower writing line, on the lower writing line;
    forming a first insulating film so as to cover the magnetoresistive effect element;
    forming a coating film so as to cover the first insulating film;
    exposing a top face of the magnetoresistive effect element by removing the coating film and first insulating film on the magnetoresistive effect element;
    etching the coating film so that a surface of the coating film is lower than the top face of the magnetoresistive effect element;
    forming a connecting line which is electrically connected to one of a source and drain of the selecting transistor via a connecting plug and which is electrically connected to the top face of the magnetoresistive effect element;
    forming a second insulating film serving as an interlayer dielectric film so as to cover the connecting line;
    forming an upper writing line, which crosses the lower writing line, on the second insulating film so as to cover the connecting line;
    partially removing the second insulating film to allow the second insulating film to remain below the upper writing line and around the connecting line;
    exposing the first insulating film on a side portion of the magnetoresistive effect element by removing a part or all of the coating film; and
    forming a yoke structural member, after forming the upper writing line and after exposing the first insulating film, so as to cover at least a side portion of the upper writing line and so as to contact the exposed first insulating film on the side portion of the magnetoresistive effect element to sandwich the exposed first insulating film between the yoke structural member and the side portion of the magnetoresistive effect element.

18. A method for producing a magnetic memory device as set forth in claim 17, wherein the magnetic memory device has a memory cell having one transistor-one magnetoresistive effect cell type architecture.

19. A method for producing a magnetic memory device as set forth in claim 17, wherein the step of forming the connecting line comprises:
    forming a third insulating film so as to cover the coating film, which is etched so as to be lower than the top face of the magnetoresistive effect element, and the top face and side portion of the magnetoresistive effect element;
    removing the third insulating film on the magnetoresistive effect element;
    forming a connecting line which is electrically connected to one of the source and drain of the selecting transistor via a connecting plug and which is electrically connected to the top face of the magnetoresistive effect element; and
    removing the third insulating film.

20. A method for producing a magnetic memory device as set forth in claim 17, wherein the step of forming the yoke structural member comprising:
    forming a first yoke made of a first yoke material on a top face of the upper writing line to form a first yoke;
    depositing a second yoke material so as to cover the first yoke and the upper writing line and so as to contact the exposed first insulating film; and
    partially removing a film of the deposited second yoke material to leave the film on at least the side portion of the upper writing line and on the exposed first insulating film to form a second yoke.

21. A method for producing a magnetic memory device as set forth in claim 17, wherein the step of forming the yoke structural member comprising:
    depositing a yoke material so as to cover the upper writing line and so as to contact the exposed first insulating film; and
    partially removing a film of the deposited yoke material to leave the film on at least the side portion of the upper writing line and on the exposed first insulating film.

22. A method for producing a magnetic memory device as set forth in claim 21, wherein the yoke structural material comprises a barrier metal layer of at least one layer, and at least one ferromagnetic layer.

23. A method for producing a magnetic memory device as set forth in claim 17, wherein the magnetoresistive effect element is a tunnel junction type magnetoresistive effect element comprising at least one storage layer, at least one magnetization fixed layer, and at least one tunnel hurrier layer.

24. A method for producing a magnetic memory device as set forth in claim 3, wherein the first insulating film extends on the lower line.

25. A method for producing a magnetic memory device as set forth in claim 10, wherein the first insulating film extends on the lower line.

* * * * *